United States Patent
Shau

(10) Patent No.: US 8,164,969 B2
(45) Date of Patent: Apr. 24, 2012

(54) ULTRA-LOW POWER HYBRID CIRCUITS

(76) Inventor: Jeng-Jye Shau, Palo Alto, CA (US)

( * ) Notice: Subject to any disclaimer, the term of this patent is extended or adjusted under 35 U.S.C. 154(b) by 236 days.

(21) Appl. No.: 12/749,496

(22) Filed: Mar. 29, 2010

(65) Prior Publication Data

US 2010/0231292 A1    Sep. 16, 2010

Related U.S. Application Data

(63) Continuation-in-part of application No. 12/165,658, filed on Jul. 1, 2008, now Pat. No. 7,782,655.

(51) Int. Cl.
*G11C 11/00* (2006.01)
(52) U.S. Cl. ......... 365/226; 365/227; 365/229; 327/534
(58) Field of Classification Search .................. 365/226, 365/227, 229
See application file for complete search history.

(56) References Cited

U.S. PATENT DOCUMENTS

| | | | |
|---|---|---|---|
| 5,814,845 A * | 9/1998 | Carley | 257/207 |
| 6,091,656 A | 7/2000 | Ooishi | |
| 6,100,751 A * | 8/2000 | De et al. | 327/534 |
| 6,218,895 B1 * | 4/2001 | De et al. | 327/566 |
| 6,404,670 B2 | 6/2002 | Shau | |
| 6,449,182 B1 | 9/2002 | Ooishi | |
| 6,563,758 B2 | 5/2003 | Shau | |
| 6,606,275 B2 | 8/2003 | Shau | |
| 6,608,780 B2 | 8/2003 | Shau | |
| 6,744,659 B1 | 6/2004 | Eby et al. | |
| 6,937,059 B2 * | 8/2005 | Satou et al. | 326/30 |
| 7,064,376 B2 | 6/2006 | Shau | |
| 7,069,522 B1 * | 6/2006 | Sluss et al. | 716/114 |
| 7,092,309 B2 | 8/2006 | Liaw | |
| 7,113,421 B2 | 9/2006 | Maeda | |
| 7,136,296 B2 | 11/2006 | Luk | |
| 7,154,770 B2 | 12/2006 | Islam | |
| 7,190,209 B2 * | 3/2007 | Kang et al. | 327/534 |
| 7,245,548 B2 | 7/2007 | Derner | |
| 7,292,069 B2 | 11/2007 | Hannah | |
| 7,307,899 B2 | 12/2007 | Khellah | |
| 7,372,721 B2 | 5/2008 | Sachdev et al. | |
| 7,397,721 B2 | 7/2008 | Lee | |
| 7,420,834 B2 | 9/2008 | Maeda | |
| 7,782,655 B2 * | 8/2010 | Shau | 365/154 |
| 2007/0242498 A1 | 10/2007 | Chandrakasan | |
| 2011/0074498 A1 * | 3/2011 | Thompson et al. | 327/543 |
| 2011/0267103 A1 * | 11/2011 | Gitlin et al. | 326/41 |

OTHER PUBLICATIONS

Wang, Calhoun and Chandrakasan, "Sub-Threshold Design for Ultra-Low Power Systems," Spring 2006.
B Zhai, S. Hanson, D. Blaauw, and D. Sylvester, "Analysis and Mitigation of Variability in Subthreshold Design", ACM/IEEE International Symposium on Low Power Electronics and Design, Aug. 2005.
A. Raychowdhury, B. Paul, S. Bhunia, and K. Roy, "Computing with Subthreshold Leakage: Device/Circuit/Architecture Co-Design for Ultralow-Power Subthreshold Operation", IEEE Transactions on VLSI Systems, Nov. 2005, pp. 1213-1224 (No. 105).

(Continued)

*Primary Examiner* — Viet Q Nguyen

(57) ABSTRACT

The present invention provides a solution to avoid the robustness problems of sub-threshold circuits by switching small parts of circuits to nominal-voltage only when they are being used, and switching them back to sub-threshold levels when the operation finishes. Such "hybrid sub-threshold" approach is capable of supporting ultra-low power operation without the disadvantages of sub-threshold circuits. Hybrid power saving mode for logic circuits provide significant power saving and fast recovery time without performance degradation.

12 Claims, 9 Drawing Sheets

OTHER PUBLICATIONS

A. Raychowdhury, S. Mukhopadhyay, and K. Roy, "A Feasibility Study of Subthreshold SRAM Across Technology Generations", Proceedings of the 2005 International Conference on Computer Design.

T.H. Kim, J. Liu, J. Keane, and C.H. Kim, "A 0.2 V, 480 Kb Subthreshold SRAM with 1 k Cells Per Bitline for UltraLow-Voltage Computing", IEEE J. of Solid-State Circuits, vol. 43, No. 2, Feb. 2008, pp. 518-529.

B. H. Calhoun, and A. P. Chandrakasan, "A 256-Kb 65-nm Subthreshold SRAM Design for Ultra-Low-Voltage Operation", IEEE J. of Solid-State Circuits, vol. 42, No. 3, Mar. 2007, pp. 680-688.

T.H. Kim, J. Liu, J. Keane, and C.H. Kim, "A High-Density Subthreshold SRAM with Data-independent Bitline Leakage and Virtual Ground Replica Scheme", ISSCC, vol. 11, Issue 15, Feb. 2007, pp. 330-606.

T. Kim, H. Eom, J. Keane, and C. Kim, "Utilizing Reverse Short Channel Effect for Optimal Subthreshold Circuit Design", ISLPED, Oct. 4, 2006.

A. Wang, A. Chandrakasan, "A 180mV FFT Processor Using Subthreshold Circuit Techniques", ISSCC, 2004.

C. H. Kim, et al. "Ultra-low power DLMS adaptive filter for hearing add applications", IEEE TVLSI, Dec. 2003, pp. 1058-1067.

B. Calhoun, A. Chandrakasan, "Static Noise Margin Variation for Sub-threshold SRAM in 65-nm CMOS", IEEE Journal Solid-State Circuits, vol. 41, Issue 7, Jul. 2006, pp. 1673-1679.

J. F. Ryan, J. Wang, and B. H. Calhoun, "Analyzing and Modeling Process Balance for sub-threshold circuit design", Proceedings of the 17th ACM Great Lakes symposium on VLSI, 2007.

"A PLA based asynchronous micropipelining approach for sub-threshold circuit design", Proceedings of the 43rd annual conference on Design Automation, Session 27, 2006, pp. 419-424.

L. Nazhandali, B. Zhai, J. Olson, A. Reeves, M. Minuth, R. Helfand, S. Pant, T. Austin, and D. Blaauw, Energy Optimization of Subthreshold-Voltage Sensor Network Processors, 32nd Annual International Symposium on Computer Architecture, 2005, pp. 197-207.

H. Soeleman, K. Roy, "Ultra-Low power digital subthreshold logic circuits", 1999 International Symposium on Low Power Electronics and Design, pp. 94-96.

"Double Gate-MOSFET subthreshold circuit for ultra low power applications", IEEE transactions on Electron Devices, vol. 51, Issue 9, Sep. 2004, pp. 1468-1474.

L. Nghandali, et al. "Energy optimization of subthreshold-voltage sensor network processors", ACM ISCA 2005.

B. Zhai, D. Blaauw, D. Sylvester, K. Flautner, "Theoretical and practical limits of dynamic voltage scaling", DAC 2004.

B. H. Calhoun, A. Chandrakasan, "Characterizing and modeling minimum energy operation for subthreshold circuits," ISLPED 2004.

* cited by examiner

Figure 1: Prior Art
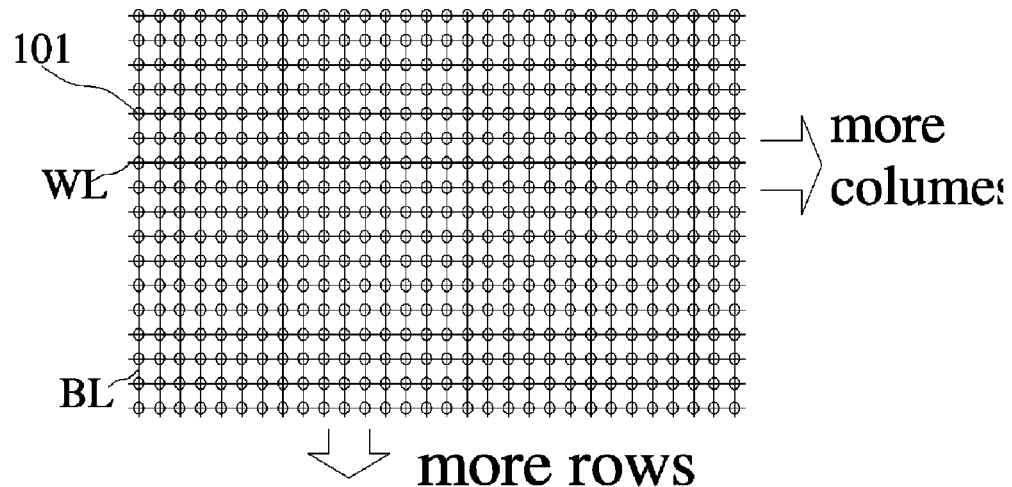
Figure 2(a): Prior Art
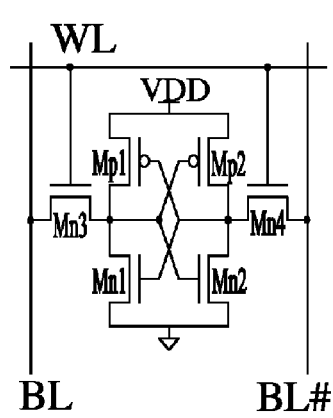
Figure 2(b): Prior Art
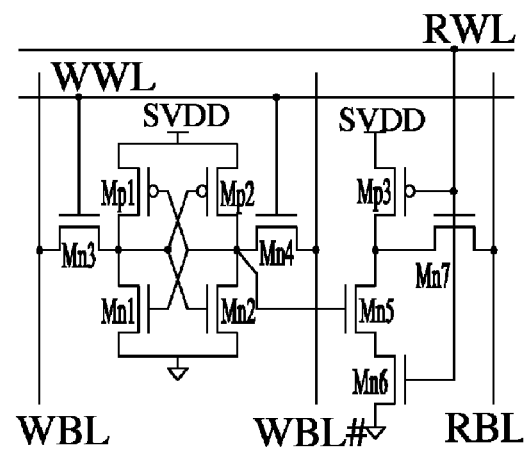

Figure 6(a): Prior Art

ULTRA-LOW POWER HYBRID CIRCUITS

This application is a continuation-in-part application of previous patent application with a Ser. No. 12/165,658 with the title "Ultra-Low Power Hybrid Sub-Threshold Circuits" and filed by the applicant of this invention on Jul. 1, 2008 now U.S. Pat. No. 7,782, 655.

BACKGROUND OF THE INVENTION

The present invention relates to ultra-low power integrated circuits (IC), and more particularly to ultra-low power integrated circuits that can switch rapidly from power saving mode to active mode.

In recent years, the explosive growth of battery-powered portable applications, such as cellular phones and laptop computers, has generated tremendous demand for ultra-low power integrated circuits. Sub-threshold circuits, by definition, are integrated circuits designed to operate at power supply voltages lower than the threshold voltages of Complementary Metal Oxide Semiconductor (CMOS) transistors. At sub-threshold operation, transistor currents are reduced by many orders of magnitudes, promising ultra-low power operations. Although studies of sub-threshold circuits have reported promising results with respect to power saving, the technology has yet to be implemented on practical mass production products. A number of critical problems preventing their practical use have been identified:

Performance Problems: Low voltage operation typically can reduce power by one or more orders of magnitudes; however, it also slows down processing speed by one or more orders of magnitudes. Although architectural techniques such as pipelining and parallelism can help compensate for loss in performance, these techniques introduce significant overheads in power and cost. Slow processing speed is not the only performance problem; the worst problem is inconsistency in speed. Under sub-threshold operation, a gate delay can vary by 300% due to natural doping variations. These performance problems will disable most applications.

Stability Problems: Transistors in sub-threshold circuits operate at weak inversion conditions in which the source-drain current is an exponential function of temperature, voltage, and manufacturing parameters. Therefore, non-ideal effects (e.g., process variation, noise) are magnified exponentially, causing severe stability problems. Practical-scale integrated circuits can not operate with such stability problems.

Yield Problems: Due to the sensitivity of sub-threshold circuits, their effective defect density is significantly higher than that of nominal-voltage circuits. As a result, the yield of sub-threshold circuits is significantly lower than nominal voltage circuits, making it impractical to build large-scale integrated circuits.

Test Coverage Problems: Because sub-threshold circuits are sensitive to temperature, voltage, and noise, they are likely to have pattern-dependent or event-dependent failures. Testing methodologies developed for nominal-voltage circuits typically are not adequate for sub-threshold circuits.

Reliability Problems: Reliability failures are typically caused by marginal manufacturing defects that are not significant enough to prevent the IC from passing a production test but can cause failure under use. Test-coverage problems and circuit sensitivity are always followed by reliability problems. Reliability problems are the worst kind of problems due to potentially severe consequences.

In the following discussions, we will call the above problems in performance, stability, yield, test coverage, and reliability as the "sub-threshold problems" because they happen when integrated circuits are under sub-threshold operations. Robustness, consistence, testability, and reliability are absolutely essential requirements for IC technologies. The above problems of sub-threshold circuits outweigh their power saving advantage. These problems must be solved before practical applications of sub-threshold circuits can be built.

We believe power saving sub-threshold technology is extremely valuable because of its commercial and environmental benefits. However, sub-threshold circuits are not ready for practical-scale integrated circuits because of the aforementioned problems. It is therefore highly desirable to develop ultra-low power IC design technology that can avoid the "sub-threshold problems".

In U.S. Pat. No. 7,307,899 Khellah et al disclosed a method to reduce power consumption in SRAM by dividing memory devices into "banks" that maybe individually put into "sleep mode" via "sleep transistors". Khellah et al further divide memory banks into "blocks" or "tiles" and execute switching between sleep mode and active mode progressively. The tiles in Khellah et are still too large relative to small block architecture. This patent never mentioned power supply voltages lower than threshold voltages so that this patent is not related to sub-threshold circuits. The mechanisms that switches large blocks of memory cells typically cause performance degradation, and the power overhead needed to support such switching mechanism also can be higher than the power it can save. In U.S. Pat. No. 7,420,834 and in U.S. Pat. No. 7,113, 421 Maeda et al disclosed methods to improve read/write noise margins by using lower operation voltages for SRAM write relative to the operation voltages used for SRAM read operations. In U.S. Pat. No. 7,154,770 Islam et al disclosed a similar method. These patents never mentioned power supply voltages lower than threshold voltages so that they are not related to sub-threshold circuits. The mechanisms are also not related to steady-state power savings. In U.S. Pat. No. 6,744, 659 Eby et al disclosed a method to reduce SRAM sub-threshold leakage current using body effects of SRAM memory cell transistors. In U.S. Pat. No. 7,092,309 Liaw et al disclosed a method to reduce SRAM power by selectively changing power supply voltages according to word line select signals. In U.S. Pat. No. 7,372,721 Sachdev et al disclosed a method to reduce SRAM leakage current by controlling the virtual ground notes of SRAM memory cells along one column in a memory array. These patents never mentioned power supply voltages lower than threshold voltages so that this patent is not related to sub-threshold circuits. The power saving mechanism is also different. In U.S. Pat. No. 7,397, 721 Lee et al disclosed a method for programmable control of SRAM power supply voltage at standby mode. This patent never mentioned power supply voltages lower than threshold voltages so that this patent is not related to sub-threshold circuits. The method applies voltage to large memory array(s) so that the method is not suitable for high speed switching. The power saving mechanism is different. In US. Patent Application No. 2007, 0242,498 Chandrakasan et al disclosed a sub-threshold SRAM cell that comprises 10 transistors (10T). This 10T cell helps to improve stability problems of conventional art sub-threshold SRAM cells, but it still have all the "sub-threshold problems". These and other references provide partial solutions to SRAM power saving problems, but all of them did not provide the capabilities to switch rapidly from power saving mode to high performance operations modes.

This patent application is a continuation-in-part application of previous patent application with a Ser. No. 12/165,658 and filed by the applicant of this invention on Jul. 1, 2008. The discussions in previous patent application focused on hybrid sub-threshold SRAM devices. This patent application provides additional discussions on hybrid circuits, and more particularly on ultra-low power logic circuits that can switch rapidly from power saving mode to active mode.

SUMMARY OF THE INVENTION

The primary objective of this invention is, therefore, to provide ultra-low power integrated circuits that can avoid the "sub-threshold problems". The other objective of this invention is to provide Static Random Access Memory (SRAM) devices that consume less power than current art sub-threshold SRAM while maintaining the robustness of nominal-voltage SRAM. Another objective is to design logic circuits that can support ultra-low power operations without suffering the "sub-threshold problems". Another primary objective is to provide ultra-low power logic circuits that can switch rapidly from power saving mode to nominal operations.

These and other objectives are achieved by switching small parts of circuits to nominal-voltage only when they are being used, and switching them back to ultra-low power modes when the operation finishes. We will call such an approach of the present invention the "hybrid circuit" approach. The resulting circuits are capable of supporting ultra-low power operation without the disadvantages of conventional circuits or sub-threshold circuits.

While the novel features of the invention are set forth with particularly in the appended claims, the invention, both as to organization and content, will be better understood and appreciated, along with other objects and features thereof, from the following detailed description taken in conjunction with the drawings.

BRIEF DESCRIPTION OF THE DRAWINGS

FIG. 1 is a simplified symbolic diagram of a prior art SRAM array;

FIG. 2(a) is a schematic diagram of prior art 6-transistor (6T) SRAM memory cell;

FIG. 2(b) is a schematic diagram of prior art 10-transistor (10T) SRAM memory cell;

DETAILED DESCRIPTION OF THE INVENTION

Figure 3:
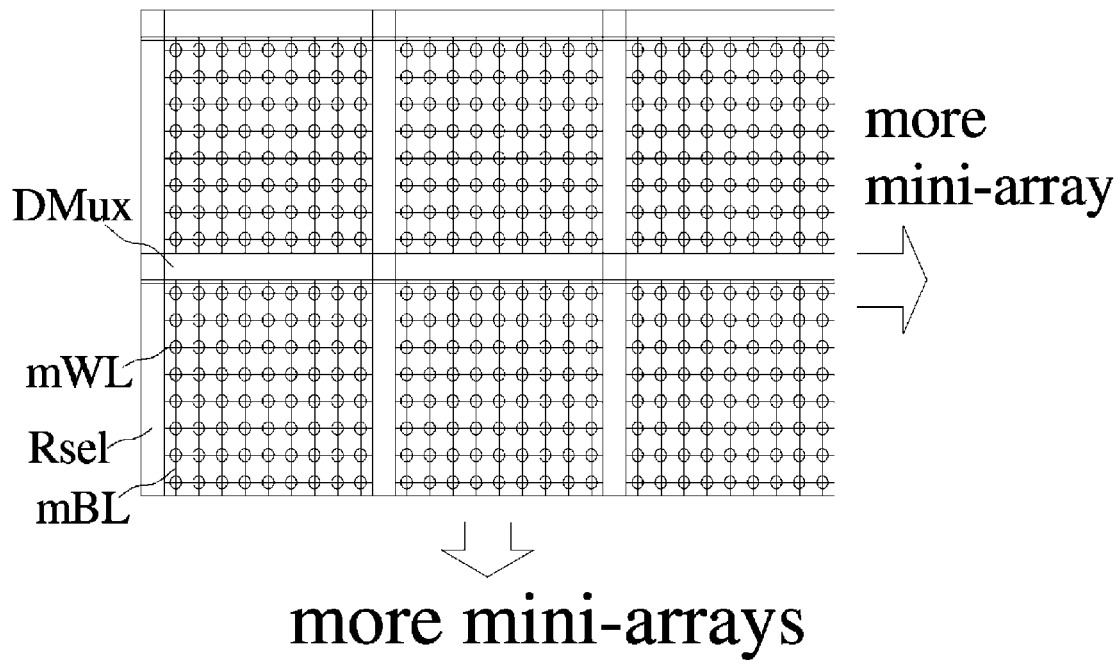
FIG. 3 is a simplified symbolic diagram of an SRAM array comprising mini-arrays.

To facilitate understandings of the present invention, we will start with a specific application in Static Random Access Memory (SRAM) design as an example to demonstrate the problems with existing approaches and the principles of the present invention.

Conventional SRAM is designed as a two dimensional array of memory cells as illustrated by the symbolic view in FIG. 1. In this figure, a memory cell (101) is represented symbolically by a circle, word lines (WL) are represented by horizontal lines, and bit lines (BL) are represented by vertical lines. For clarity, we are using simplified symbolic views in our discussion. In reality, each memory cell can have multiple word lines and multiple bit lines.

To read data from a conventional memory array, one word line (WL) is activated (illustrated by a bold line in FIG. 1) to turn on all the memory cells along one horizontal row. Each selected memory cell discharges one vertical bit line so the data stored in selected memory cells can be detected. During this process, all the memory cells in the memory array are disturbed.

FIG. 2(a) shows a schematic of a 6-transistor (6T) memory cell. This memory cell comprises two p-channel transistors (Mp1, Mp2) and 4 n-channel transistors (Mn1-Mn4). Transistors Mp1, Mn1, Mp2, and Mn2 are configured as back-to-back inverters to hold data by a positive feedback mechanism. The sources of n-channel transistors (Mn1, Mn2) are connected to ground. The sources of p-channel transistors (Mp1, Mp2) are connected to power supply (VDD). In this patent application, we define the node connected to the p-channel transistors of back to back inverters in an SRAM memory cell as "memory cell power supply". In prior art SRAM, the memory cell power supply (VDD) of the 6T cell is connected to that of all memory cells in the same memory array. The 6T cell is selected by a word line (WL) through transistors Mn3 and Mn4 so that data can be read/written by a pair of bit lines (BL, BL#). This 6T cell has been widely used in the IC industry. For IC technologies older than 150 nm technologies, the SRAM cell consumes little power. Starting from 150 nm technologies, the SRAM memory cells produced by advanced IC technologies started to consume significant power due to sub-threshold leakage current as well as gate leakage current. Such leakage current increases with power supply voltage so for advanced IC technologies, it is desirable to reduce the power supply voltage to save power. We will call IC technologies supporting transistor channel lengths shorter than 150 nm as "advanced IC technologies".

As reported by many researchers, the 6T cell can not support both read and write operations reliably under sub-threshold operation for advanced IC technologies. To solve this problem, additional transistors were added to the memory cell to form 8T-10T cells. In particular, the 10T cell shown in FIG. 2(b) was studied. The 10T cell uses one word line (WWL) and a pair of bit lines (WBL, WBL#) to support write operations while using a separate word line (RWL) and bit line (RBL) to support read operations. The 10T cell functions in the same way as conventional 6T cells do for write operations, but use an additional 4 transistors (Mp3, Mn5-Mn7) to support read operations. The memory cell power supply (SVDD) of a 10T cell is biased at sub-threshold region. For 10T and other enhanced memory cells, more transistors were added to support sub-threshold operations. Such solutions introduce significant overheads, and suffer from the "sub-threshold problems" discussed previously.

In summary, sub-threshold SRAMs designed using conventional architecture suffer from the following problems:
(1) High operation power: the whole array is discharged to read one set of data;
(2) High cost: the memory cells are expensive; and
(3) The "sub-threshold problems": low performance, instability, test difficulties, and poor reliability.

The "sub-threshold problems" only exist for sub-threshold circuits; they do not exist for nominal-voltage circuits. If we switch a small fraction of circuits to nominal-voltage only when they are being used, and switch them back to sub-threshold levels when the operation finishes, all the "sub-threshold problems" disappear, but the power saving advantages of pure sub-threshold circuits remain. We will call such an approach of the present invention the "hybrid sub-threshold" approach. While SRAM design is used to demonstrate an application of the hybrid sub-threshold approach, the same approach is applicable to logic circuits and other types of circuits.

Conventional SRAM designers try to make the memory array as large as possible to reduce cost. This approach breaks down when using sub-threshold technology. Researchers have already reported that 6T memory cells can not work in large sub-threshold memory arrays. The 10T memory cell solution adds additional overhead and still has the "sub-threshold problems". To solve these problems, we propose changing the paradigm that bigger is better for memory arrays. We should use small memory arrays instead. Normally, using small memory arrays to support large scale integrated circuits would create unacceptable overheads. The mini-array architecture solves this problem.

In mini-array architecture, a large array is divided into many small mini-arrays as illustrated by the symbolic diagram in FIG. 3. The memory cells in the mini-arrays are connected to horizontal mini word lines (mWL) and vertical mini bit lines (mBL) in the same ways as in conventional memory arrays, except the lengths of mWL and mBL are relatively short. Each mini-array is equipped with simplified peripheral circuits, so that operations in one mini-array will not influence operations in other mini-arrays. The mini-arrays communicate with external circuits through upper level word lines and upper level bit lines (not shown for simplicity). To read data from a mini array, one upper level word line is activated. This upper word line signal is qualified by row select switches (Rsel), so that only one of the mini word lines in one mini-array is activated. Only the mini-bit-lines in the same mini-array are discharged by the selected memory cells, while all the other circuits are not disturbed. A data multiplexer (DMux) is used to control data operations of a mini-array.

Figure 4A:
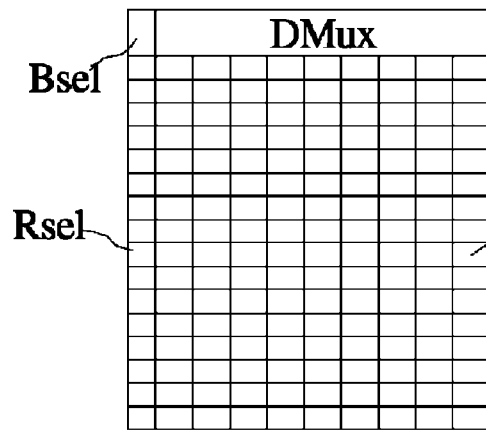
FIG. 4(a) is a simplified symbolic diagram of mini-arrays.

To support independent operations, a mini-array is equipped with a block select circuit (Bsel), row select circuits (Rsel), and a data multiplexer (DMux), as illustrated in FIG. 4(a). These mini-array peripheral circuits add an array area overhead of approximately 20%.

Figure 4B:
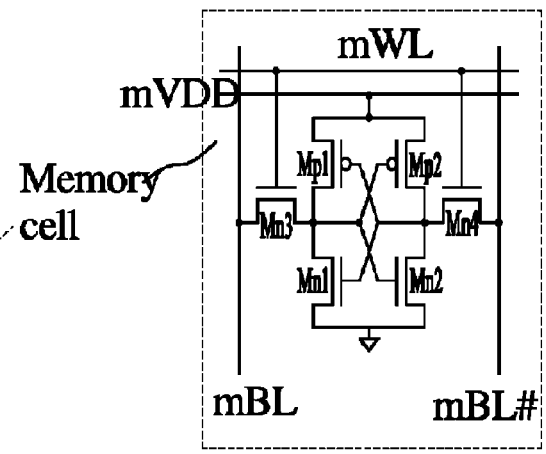
FIGS. 4(b-d) are exemplary schematic diagrams of 6T memory cells that can support hybrid operations.
Figure 5A:
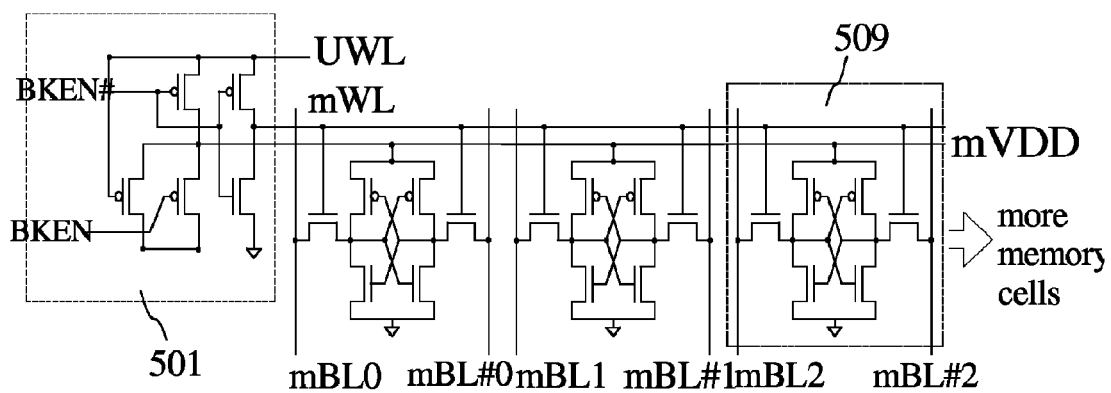
FIGS. 5(a, b) are exemplary schematic diagrams of mini rows that can support hybrid operations.

FIG. 4(b) shows one example of a hybrid sub-threshold SRAM memory cell. This cell is identical to the conventional 6T cell except its memory cell power supply (mVDD) is connected only to the memory cells in the same mini row. The word line of the memory cell is connected to the mini word line (mWL) and the bit lines of the memory cell are connected to mini bit lines (mBL, mBL#). As illustrated in FIG. 5(a), a row select circuit (501) controls the mWL and mVDD of one mini-row. A wire that connects the memory cell power supply of a subset of memory cells in an SRAM device is called a "memory cell power supply line" of the present invention. The memory cells (509) in the same mini row share the same memory cell power supply line (mVDD) but are connected to different mini bit lines (mBL0, mBL#0, mBL1, mBL#1, mBL2, mBL#2). When the memory cells are not used, mWL is at ground voltage and mVDD is at sub-threshold voltage (SVDD). When reading or writing the memory cells, block select signals (BKEN, BKEN#) qualify the upper word line (UWL) and control the voltage on the mini word line (mWL) and on the memory cell power supply line (mVDD). For selected memory cells, the mWL and mVDD are pulled up to nominal voltages, while for unselected memory cells, mWL is at ground voltage and mVDD is at sub-threshold voltage; that is, the selected 6T cell operates like a conventional nominal-voltage SRAM during read/write operations, and operates like a sub-threshold circuit at idle states. Table 1 lists the states of memory cell word line and memory cell power supply line.

TABLE 1

| operations | Word line voltage | Power supply line voltage |
|---|---|---|
| Memory cell not selected | Ground | Sub-threshold voltage |
| Memory cell selected for read or write | Nominal-voltage | Nominal-voltage |

Figure 4C:
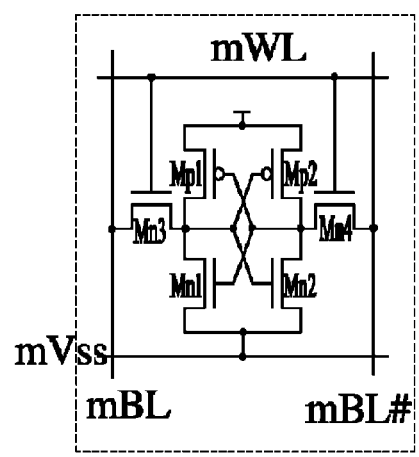
Figure 5B:
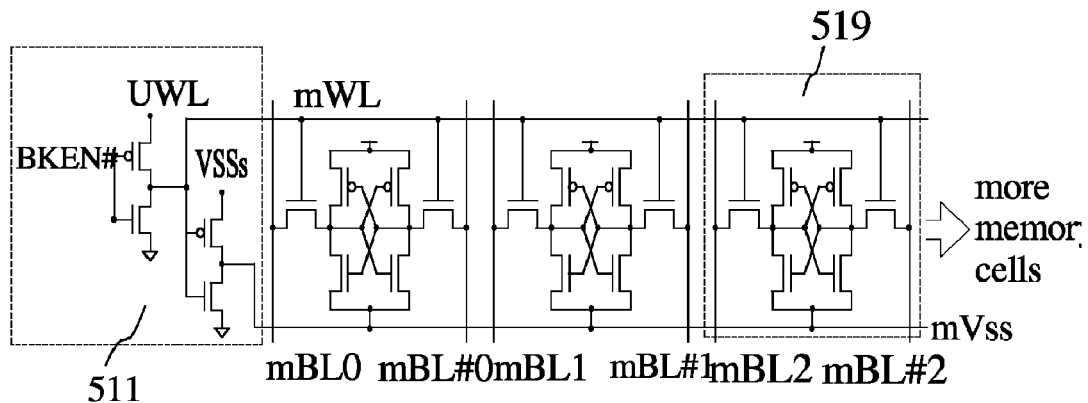

While specific embodiments of the invention have been illustrated and described herein, it is realized that other modifications and changes will occur to those skilled in the art. For example, the "memory cell power supply line" that is used to switch between nominal state and sub-threshold state does not have to be mVDD in FIG. 4(b). The line connected to the sources (mVss) of the n-channel transistors (MN1, MN2) in the memory cell, as shown in the example in FIG. 4(c), also can be a "memory cell power supply line" used to switch connected memory cells to operate in nominal state or in sub-threshold state. The memory cell in FIG. 4(c) is identical to the conventional 6T cell except its memory cell power supply (mVss) is connected only to the memory cells in the same mini row. The word line of the memory cell is connected to the mini word line (mWL) and the bit lines of the memory cell are connected to mini bit lines (mBL, mBL#). As illustrated in FIG. 5(b), a row select circuit (511) controls the mWL and mVss of one mini-row. The memory cells (519) in the same mini row share the same memory cell power supply line (mVss) but are connected to different mini bit lines (mBL0, mBL#0, mBL1, mBL#1, mBL2, mBL#2). When the memory cells are not used, mWL is at ground voltage and mVss is pulled higher to a voltage (VSSs) where the relative amplitude of power supply voltage on the memory cell (VDD−VSSs) is smaller than the threshold voltages of the memory cell transistors (MN1, MN2). When reading or writing the memory cells, a block select signal (BKEN#) qualify the upper word line (UWL) and control the voltage on the mini word line (mWL) and on the memory cell power supply line (mVss). For selected memory cells, the mWL is pulled up to nominal voltage and mVss is pulled down to nominal voltages (typically at ground voltage), while for unselected memory cells, mWL is at ground voltage and mVss is at VSSs so that the power supply voltage (VDD−mVss) is lower than sub-threshold voltage; that is, the selected 6T cell operates like a conventional nominal-voltage SRAM during read/write operations, and operates like a sub-threshold circuit at idle states. Table 1 lists the states of mWL and memory cell power supply line(s).

Figure 4D:
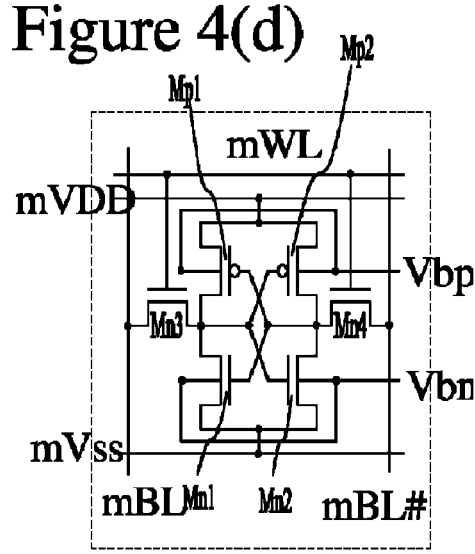

While specific embodiments of the invention have been illustrated and described herein, it is realized that other modifications and changes will occur to those skilled in the art. In the example memory cell shown in FIG. 4(b), the "memory cell power supply line" is connected to the sources (mVDD) of the p-channel transistors (MP1, MP2); in the example in FIG. 4(c), the "memory cell power supply line" (mVss) is connected to the sources (mVss) of the n-channel transistors (MN1, MN2); we certainly can have both types of memory cell power supply lines (mVDD, mVss) as shown by the memory cell shown in FIG. 4(d). This memory cell can be switched between sub-threshold state and nominal state by controlling the voltage of mVDD, mVss or both memory cell power supply lines. In addition, the substrate voltages (Vbp) of the p-channel transistors (MP1, MP2) and/or the substrate voltage (Vbn) of the memory cell n-channel transistors (MN1, MN2) also can be controlled to reduce leakage current by body effects. When the relative amplitude of (mVDD−mVss) is lower than the threshold voltages of memory cell transistors (MP1, MP2, MN1, MN2), by definition, the memory cell is in sub-threshold voltage state.

Tables 1(a, b) compare exemplary operation voltages between conventional SRAM and the operation voltages of an exemplary hybrid sub-threshold SRAM. Signal names in Tables 1(a, b) are signal names shown in FIG. 4(d). Conventional 130 nanometer SRAM memory cell is typically biased at 1.2 volts and 0 volts as shown in Table 1(a). Table 1(b) shows one example of the voltages applied on a hybrid sub-threshold SRAM memory cell. At standby mode, mVss is pulled up to 0.9 volts so that the memory cell is under sub-threshold voltage. In addition, in this example the p-channel substrate voltage (Vbp) is biased at a voltage higher than mVDD to reduce leakage current of p-channel transistors by body effects. Our studies showed that the standby leakage current can be reduced by order(s) of magnitude(s) under such conditions. During read or write operations, mVss is pulled down to zero volts so that the memory cell behaves as normal circuits; in this example Vbp stay at higher voltage when the memory cell is read or written. For applications that speed is more important than power, it maybe desirable to switch mVss to a lower voltage (0.6 volts instead of 0.9 volts in this example) as shown in Table 1(c). For the example shown in Table 1(c), the circuit is no longer in sub-threshold operation because mVDD−mVss can be higher than threshold voltage, instead, it is under hybrid operation.

TABLE 1a

Typical operation voltages of conventional 130 nm SRAM

| operations | mWL | VDD | Vss |
| --- | --- | --- | --- |
| Standby | 0 volts | 1.2 volts | 0 volts |
| Read or Write | 1.2 volts | 1.2 volts | 0 volts |

TABLE 1(b)

Hybrid sub-threshold operation voltages of 130 nm SRAM

| operations | mWL | mVDD | mVss | Vbp | Vbn |
| --- | --- | --- | --- | --- | --- |
| Standby | 0 volts | 1.2 volts | 0.9 volts | 1.8 volts | 0 volts |
| Read or Write | 1.2 volts | 1.2 volts | 0 volts | 1.8 volts | 0 volts |

TABLE 1(c)

Hybrid mode operation voltages of 130 nm SRAM

| operations | mWL | mVDD | mVss | Vbp | Vbn |
| --- | --- | --- | --- | --- | --- |
| Standby | 0 volts | 1.2 volts | 0.6 volts | 1.8 volts | 0 volts |
| Read or Write | 1.2 volts | 1.2 volts | 0 volts | 1.8 volts | 0 volts |

While specific embodiments of the invention have been illustrated and described herein, it is realized that other modifications and changes will occur to those skilled in the art. The hybrid sub-threshold approach or hybrid operation of the present invention is more effective for SRAM arranged in mini-array architecture, but it is still applicable for SRAM arranged in other architectures. We used 6T memory cell in the above example, while other memory cells (such as 5T cell) are equally applicable. The 6T cell also can be used to support dual port operations. There are many ways to design the row select circuits; the design in FIGS. 5(a, b) was just two of many possible designs. In the above example, the memory cells in one mini-row share the same memory cell power supply line, but that is not the only possible arrangement. Sometimes it is desirable to connect two nearby rows to simplify memory cell power supply line connections. It is certainly applicable to connect all the memory cells in the same mini-array to further simplify connection. When a memory cell power supply line is connected to more memory cells, power consumption is higher because we may switch the memory cell power supply of unused memory cells, but the control circuit is simplified. It is certainly applicable to have more than one memory cell power supply lines along one row of memory cells.

The magnitudes of sub-threshold voltage and nominal-voltage are dependent on IC manufacture technologies. A sub-threshold voltage, by definition, is lower in absolute value than the typical threshold voltage of CMOS transistors. The threshold voltages of transistors can be changed by substrate bias voltages (Vbp, Vbn). Therefore, threshold voltage value should be measured at conditions when the substrate terminal and the source terminals of MOS transistors are at common voltages. Most of IC manufacturers publish the values of typical threshold voltages so that the values of "typical threshold voltage" can be easily obtained. For example, for standard 130 nm logic technologies, the threshold voltage of n-channel logic transistor is typically about 0.35 volts. A nominal-voltage, by our definition, is a voltage higher than twice the typical threshold voltage, in absolute value, of CMOS transistors. For example, for standard 130 nm logic technologies, a nominal-voltage is equal to or higher than 0.7 volts. Typically, a nominal-voltage is close to the standard power supply voltage of core logic circuits. For example, for standard 130 nm logic technologies, the standard power supply voltage is 1.2 volts and nominal-voltage for 130 nm technology is typically close to 1.2 volts. IC manufactures typically publishes the nominal operation voltage for manufacture technologies.

Although changing the memory cell power supply voltage may sound dangerous, it can be designed to be safe when the mini row is short. The mini bit lines are also desirable to be short; when the mini-bit lines are short, sense amplifiers are no longer necessary. Instead, simple inverters can read the data. Removing sense amplifiers can save a lot of power while improving robustness. A mini-array is much smaller than a conventional SRAM array. Typically, a mini word line is connected to 20 or less memory cells while a mini bit line is connected to 64 or less memory cells. In the following example, we will assume that the mini-array is 8 memory cells on a mini word line and 32 memory cells on a mini bit line.

Figure 6B:
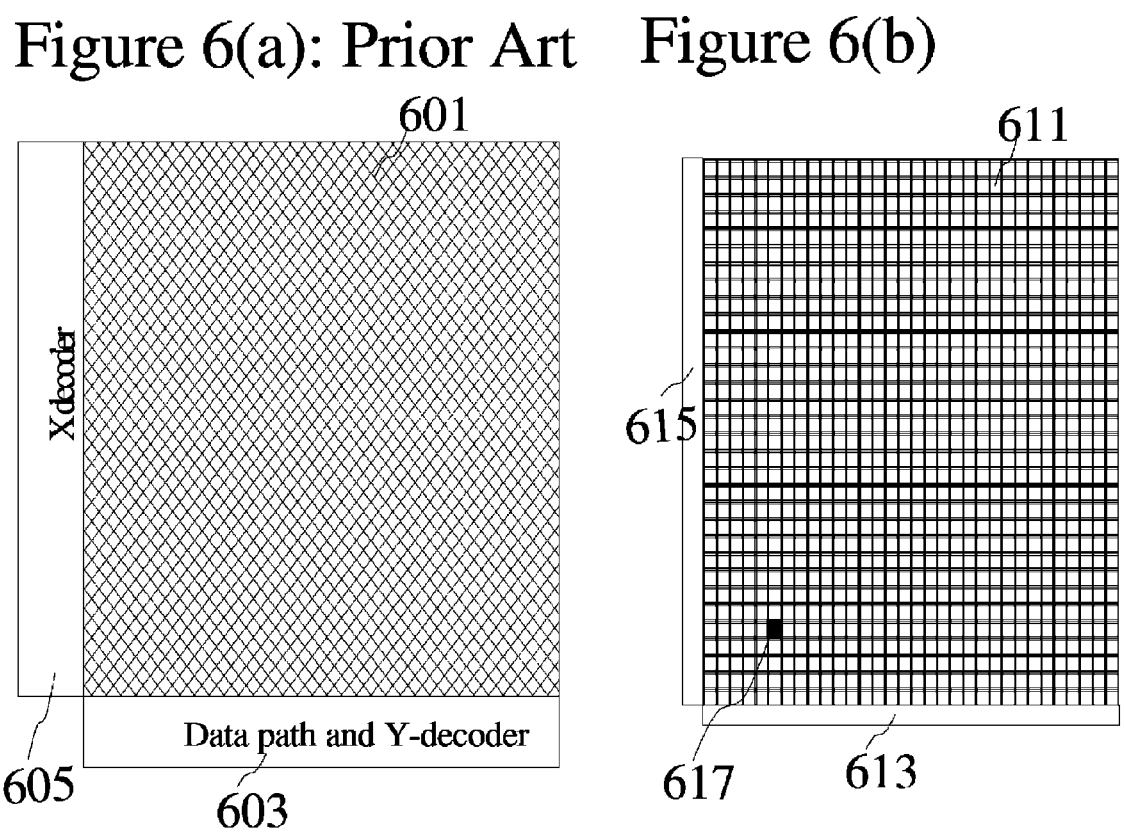
FIGS. 6(a, b) compare prior art SRAM structures with SRAM in small block architecture.

Conventional memory designers try to put as many memory cells as possible along both the word line and bit line directions in order to reduce cost. For example, a memory array with 256 cells on one word line and 1024 cells on one bit line has been reported. FIGS. 6(a) and 6(b) are simplified symbolic diagrams illustrating the relative sizes of circuit components between the conventional design in FIG. 6(a) and the mini-array design in FIG. 6(b), assuming both SRAM devices comprise the same number of memory cells (256× 1024 in this example). We will use the example of FIGS. 6(a) and 6(b) to compare the differences between conventional architecture and mini-array architecture.

Operation Power: In the conventional architecture, when 8 bits of data need to be read, the X decoder (605) determines which word line to look at. This turns on all 256 memory cells on that word line, discharging all 256 bit lines connected to those 256 memory cells. Since these bit lines are connected to memory cells on every other word line, this means 262144 memory cells are disturbed (if the array has 1024 word lines). In the mini-array architecture, when 8 bits of data need to be read, we only select 8 memory cells along a mini word line. This turns on only 8 memory cells and discharges 8 mini bit lines that are connected to 256 memory cells in a mini-array (617). All the other memory cells are not disturbed. At the upper level, an upper level word line is turned on. UWL is connected to 32 block select circuits with much lower loading. The data read from the mini-array goes through 8 upper level bit lines that are connected to 32 mini-array data paths. The upper level bit line loading is far less than that of conventional SRAMs.

In summary, the difference in the effective loading during a read operation is 1-2 orders of magnitudes. Because operational power is proportional to loading, the mini-array SRAM can reduce operational power by 1-2 orders of magnitude. Table 2 summarizes this comparison.

TABLE 2 comparison in active loading for memory read operation

| | Conventional architecture | Hybrid sub-threshold SRAM arranged in Mini-array architecture | Ratio in loading |
|---|---|---|---|
| Selected memory cells | 256 | 8 | 32:1 |
| Disturbed memory cells | 262144 | 256 | 1024:1 |
| Word line loadings | One word line with 512 gates | One mWL with 16 gates and One UWL with 32 gates and 32 diffusion contacts | ~10:1 |
| Bit line loadings | 256 bit lines with 262144 diffusion contacts | 8 mini bit lines with 256 diffusion contacts and 8 upper level bit lines with 256 diffusion contacts | ~30:1 |

Idle Power: While conventional sub-threshold SRAM supports read/write operations under sub-threshold voltage, mini-array SRAM needs only to hold data at sub-threshold operation. Consequently, we can operate at lower voltage than conventional sub-threshold SRAM, which means that much lower idle power is expected. In addition, the proposed design will use 50% fewer transistors than 10T SRAM. We can expect idle power one order of magnitude lower than pure sub-threshold SRAM, which is equivalent to two orders of magnitude lower than nominal-voltage SRAM.

Cost Comparison: Conventional SRAM requires big decoders (605) to drive the heavy loadings on a word line and large numbers of sense amplifiers and drivers (603) to support data paths that connect to a large number of bit lines. In mini-array architecture, we will incur ~20% overhead on mini-array peripheral circuits. However, the upper level decoders (615) and data paths (613) are much smaller due to simplified active loading as illustrated by the relative sizes shown in FIGS. 6(a, b). We can easily achieve much lower cost.

Performance and Robustness: Academically speaking, hybrid sub-threshold SRAM is not pure sub-threshold SRAM. At idle conditions, the whole SRAM is under sub-threshold voltage. At operational conditions, 262136 memory cells stay in a sub-threshold idle state while 8 selected memory cells operate at nominal-voltage read/write operation. In effect, by allowing only 0.03% of memory cells (plus ~0.2% of peripheral circuits) to operate at nominal-voltage conditions, all the problems of sub-threshold circuits can be bypassed, while the same robustness of conventional nominal-voltage circuits can be achieved. Performance would be expected to be better than nominal-voltage SRAM due to smaller loadings.

While specific embodiments of the invention have been illustrated and described herein, it is realized that other modifications and changes will occur to those skilled in the art. The scope of the present invention should not be limited by the above specific examples. A Static Random Access Memory (SRAM) device of the present invention divides its memory cells into small sub-groups such as mini-arrays. Each sub-group contains a small fraction (less than 5%) of the memory cells in the SRAM device. The memory cell power supply of the memory cells in each sub-group are connected to one or more memory cell power supply line(s). The memory cell power supply lines of different sub-groups are separated so that the voltage on each memory cell power supply line can be controlled independently. The voltages of memory cell power supply lines are controlled by memory cell voltage control circuits. One example of the memory cell voltage control circuits is the row select circuit (Rsel) discussed in previous examples. A memory cell voltage control circuit sets the voltage of a memory cell power supply line at sub-threshold levels when the memory cells connected to the memory cell power supply line are not being accessed, and switches the voltage on the memory cell power supply line to nominal-voltage when part of or all of the memory cells connected to the memory cell power supply line are being accessed. "Access" a memory cell means "read from or write into" the memory cell.

While specific embodiments of the invention have been illustrated and described herein, it is realized that other modifications and changes will occur to those skilled in the art. The "hybrid sub-threshold" approach holds data at sub-threshold voltage while selectively bringing small fractions of circuits back to nominal voltage at operation conditions. This approach is most effective when integrated circuits are divided into small circuit modules. This hybrid sub-threshold approach provides practical solutions for all the problems of sub-threshold circuits. It allows us to utilize knowledge accumulated by the IC industry in the past 50 years instead of re-inventing everything. Hybrid sub-threshold design provides the same cost/robustness as, and better performance than, nominal-voltage circuits, while consuming significantly less power than pure sub-threshold circuits.

Figure 7A:
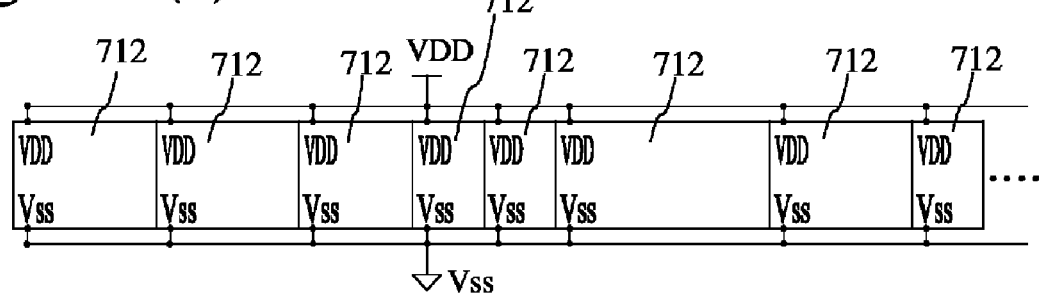
FIG. 7(a) is a simplified symbolic block diagram for a block of conventional logic circuits.
Figure 8A:
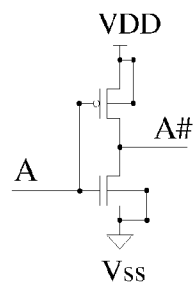
FIGS. 8(a-h) are schematic diagrams comparing conventional logic gates with hybrid circuit logic gates.
Figure 8E:
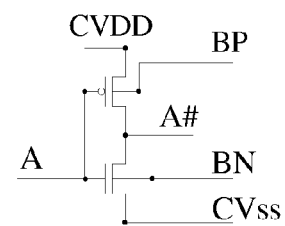
Figure 8B:
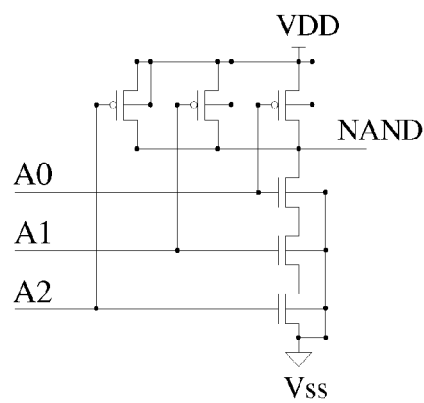
Figure 8F:
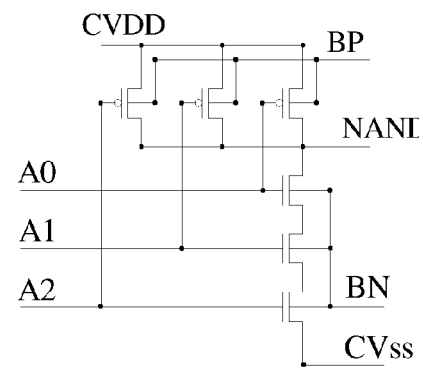
Figure 8C:
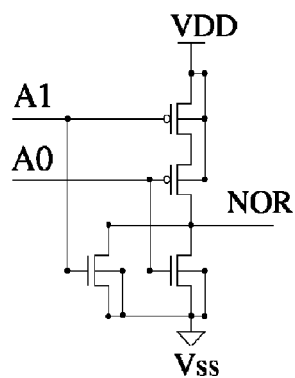
Figure 8G:
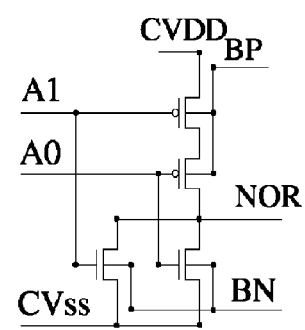
Figure 8D:
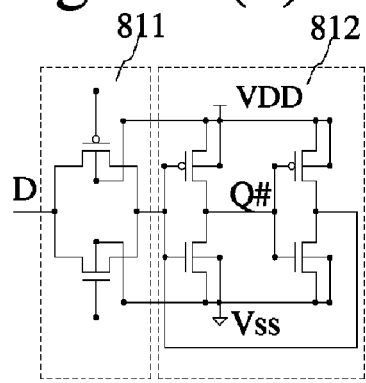

This "hybrid circuit" approach is applicable not only for SRAM, but also for other types of circuits such as logic circuits. Conventional IC logic circuits typically comprise large number of "logic gates" connected to perform logic functions. FIG. 7(a) is a simplified block diagram illustrating a conventional logic circuit block. This logic circuit block comprises a plurality of logic gates (712) while all the logic gates are connected to the same power supplies (VDD, Vss) at fixed voltages. Typically, the input and output signals to the logic gates (712) are connected through routing channels. Routing channels are not shown in our figures for simplicity. By definition, a "logic gate" is a small circuit unit that performs a pre-defined logic function. A logic gate typically comprises less than 20 transistors, and it is typically designed to be used multiple times in logic circuits. FIGS. 8(a-d) show examples of common logic gates. FIG. 8(a) is an example of an inverter that comprises a p-channel transistor with source and substrate connected together to power supply (VDD) and an n-channel transistor with source and substrate connected together to ground (Vss). The output (A#) of the inverter is the inverted logic value of its input (A). FIG. 8(b) shows the schematic diagram for a conventional three-input NAND gate where the output (NAND) of the gate is the inverted AND logic value of its three inputs (A0-A2); the substrate terminals of the p-channel transistors in this NAND gate are connected to power supply (VDD) of the same gate and the substrate terminals of the n-channel transistors in this NAND gate are connected to ground (Vss) of the same gate. FIG. 8(c) shows the schematic diagram for a conventional two-input NOR gate where its output (NOR) is the inverted OR logic value of its inputs (A0, A1); the substrate terminals of the p-channel transistors in this NOR gate are connected to the power supply (VDD) of the same gate and the substrate terminals of the n-channel transistors in this NOR gate are connected to ground (Vss) of the same gate. FIG. 8(d) shows the schematic diagram for a conventional logic gate typically called as a "latch". This latch comprises a select stage (811) and a storage stage (812); when the select stage (811) is opened, input (D) of the logic gate is written into the storage stage (812); the storage stage comprise back-to-back inverters that can hold the data (in Q#) by positive feedback mechanism when the select stage is turned off; the substrate terminals of the p-channel transistors in this storage gate are connected to power supply (VDD) of the same gate and the substrate terminals of the n-channel transistors in this storage gate are connected to ground (Vss) of the same gate. By definition, a "storage gate" is a logic gate that comprises one or more set(s) of back-to-back inverters or back-to-back NAND and/or NOR gates to hold data by positive feedback mechanisms. Common examples of storage gates are latches, flip-flops, and registers. Storage gates typically can hold data when the voltage of its power supply is reduced to sub-threshold level, but it will lose its data if the power supply is completely shut down.

In our terminology, a "logic block" is defined as a group of logic circuits connected to the same power lines. Conventional logic block in integrated circuits can have hundreds, thousands, or millions of logic gates connected to the same power supplies (VDD, Vss) at fixed values. For advanced IC technologies, the sub-threshold leakage currents of such large number of logic gates can cause significant wastes in energy. One common method to solve this problem is to shut down the whole logic circuit block by turning off the power supply of the logic block. Table 3(a) shows typical power line voltages of conventional 130 nm logic circuits. At nominal operation conditions (active mode), the power supply voltage (VDD) is at 1.2 volts, and the ground voltage (Vss) is at zero volts. At standby mode when the logic circuit block is not doing anything, the power line voltages of conventional logic circuits remain the same, and the circuits consume significant power due to sub-threshold leakage currents. Conventional power saving methods turn off the power supply so that the voltage drops near ground voltage, as shown in Table 3(a). Under such conditions, the storage gates would not be able to maintain their data. In order to bring a conventional logic block from power saving mode back to active mode, the whole block need to be re-charged, and initialization of storage gates must be executed properly. Such recovery processes typically takes many clock cycles and consume much energy.

TABLE 3a

Typical power line voltages of conventional 130 nm logic circuits

| operations | VDD for power and p-channel substrate | Vss for ground and n-channel substrate |
| --- | --- | --- |
| Active mode | 1.2 | 0 |
| Standby mode | 1.2 | 0 |
| Conventional power saving mode | 0 | 0 |

Figure 7B:
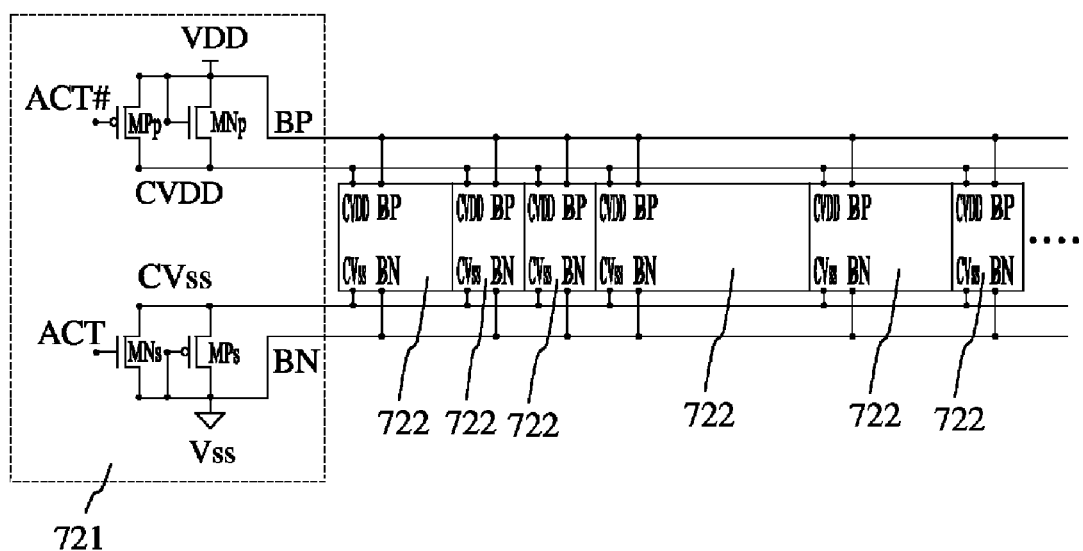
FIG. 7(b) is an exemplary symbolic block diagram for a block of hybrid logic circuits.
Figure 8H:
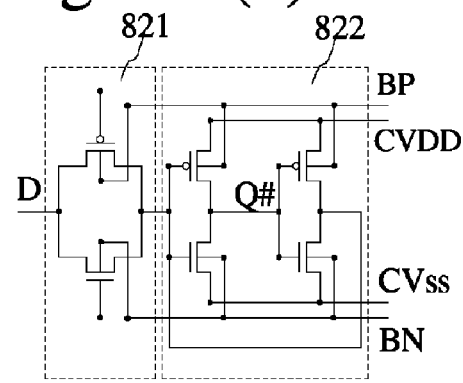

Similar to the method to solve SRAM leakage problem, the leakage currents of logic circuits can be reduced by arranging logic circuits in "small block architecture" and by using "hybrid logic gates" instead of conventional logic gates. Divide large logic circuits into small blocks; allow each small block to stay in power saving mode most of time and "recover" rapidly when it needs to execute logic functions. FIG. 7(b) illustrates one example of a small logic block called "hybrid logic block". This logic block comprises a plurality of hybrid logic gates (722) and a power line control circuit (721). FIGS. 8(e-h) show examples of hybrid logic gates. FIG. 8(e) is an example of a hybrid inverter that has the same components as the conventional inverter in FIG. 8(a) except power and substrate connections; the source terminal of the p-channel transistor in this hybrid inverter is connected to a controlled power supply line (CVDD), and the substrate terminal of the p-channel transistor is connected to a separated power line (BP); the source terminal of the n-channel transistor in this hybrid inverter is connected to a controlled power supply line (CVss), and the substrate terminal of the n-channel transistor is connected to a separated power line (BN). FIG. 8(f) is an example of a hybrid NAND gate that has the same components as the conventional NAND gate in FIG. 8(b) except power and substrate connections; the source terminals of the p-channel transistors in this hybrid NAND gate are connected to CVDD, and the substrate terminals of those p-channel transistors are connected to BP; the source terminal of the lowest n-channel transistor of the hybrid NAND gate is connected to CVss, and the substrate terminals of its n-channel transistors are connected to BN. FIG. 8(g) shows an example of a hybrid NOR gate that has the same components as the conventional NOR gate in FIG. 8(c) except power and substrate connections; the source terminals of the hybrid NOR gate n-channel transistors are connected to CVss, and the substrate terminals of those n-channel transistors are connected to BN; the source terminal of the highest p-channel transistor of the hybrid NOR gate is connected to CVDD, and the substrate terminals of its p-channel transistors are connected to BP. FIG. 8(h) is an example of a hybrid logic storage gate that has the same components as the conventional logic storage gate in FIG. 8(d) except power and substrate connections; the source terminals of the p-channel transistors in the storage stage (822) of the hybrid storage gate are connected to CVDD, and the substrate terminals of all p-channel transistors, including the p-channel transistor in its select stage (821), are connected to BP; the source terminals of the n-channel transistors in the storage stage (822) of the hybrid storage gate are connected to CVss, and the substrate terminals of all n-channel transistors, including the n-channel transistor in its select stage (821), are connected to BN.

Figure 7C:
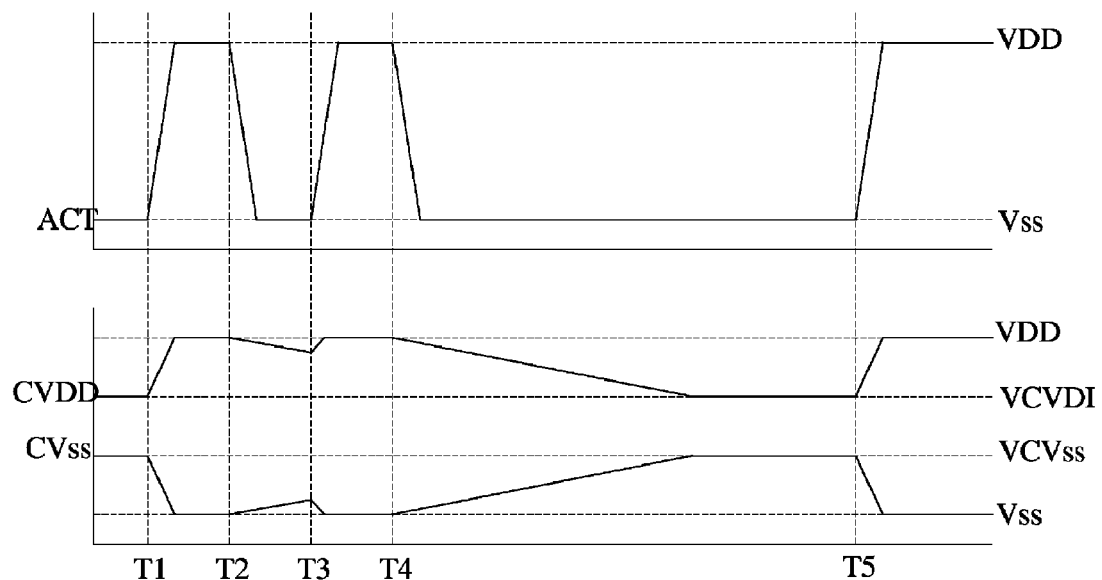
FIG. 7(c) illustrates exemplary power line waveforms for the circuit block in FIG. 7(b)

For the circuit block in FIG. 7(b), the p-channel substrate line (BP) is connected to a fixed voltage VDD, and the n-channel substrate line (BN) is connected to ground voltage Vss. The power line control circuit (721) controls the voltages on CVDD and/or CVSS as illustrated by the symbolic timing waveforms in FIG. 7(c). Initially, the circuit is at hybrid power saving mode, the control signal (CTL#) of the power control circuit (721) is high so that the p-channel transistor (MPp) connected to CVDD is off; an n-channel pull-up transistor (MNp) holds the voltage of CVDD at a steady-state voltage (VCVDD) lower than VDD, as illustrated in FIG. 7(c); In the mean time, the control signal (CTL) is low so that the n-channel transistor (MNs) connected to CVss is off; a p-channel pull-down transistor (MPs) holds the voltage of CVss at a steady-state voltage (VCVss) that is higher than Vss, as illustrated in FIG. 7(c). Due to body effects, the leakage currents of transistors at such power saving mode, called "hybrid power saving mode", can be orders of magnitudes lower than prior art logic circuits, while the storage gates still can hold their data, and the logic gates still can perform logic operations as sub-threshold circuits or low voltage circuits. At time T1, CTL is switched high and CTL# is switched low so that CVDD is switched to full power supply voltage (VDD) and CVss is switched to ground voltage (Vss), and the hybrid logic block has the same performance as conventional logic circuits. When the number of hybrid logic gates (722) connected CVDD and CVSS is less than 100 gates, the switching time from hybrid power saving mode to high performance mode can be very fast. The time needed to switch from hybrid power saving mode to active mode is called "recovery time". It is preferable to have recovery time less than one nanoseconds. It is also preferable to have recovery time less than two gate delays of typical logic gates in the logic circuit block. At time T2, CTL is switched low and CTL# is switched high so that CVDD is shifting toward VCVDD and CVss is shifting toward VCVss due to leakage currents. The switching time from active mode to hybrid power saving mode is typically longer than the recovery time, so that the power line voltages may not have enough time to reach steady-state voltages (VCVDD, VCVss) as shown in this example. At time T3, CTL is switched high and CTL# is switched low so that CVDD is quickly switched back to VDD and CVss is quickly switched back to Vss. At time T4, CTL is switched low and CTL# is switched high so that CVDD is shifting toward VCVDD and CVss is shifting toward VCVss. If time is long enough, CVDD will reach steady-state value at VCVDD, and CVss will reach steady-state value at VCVss, as illustrated in FIG. 7(c). At time T5, CTL is switched high and CTL# is switched low so that CVDD is quickly switched back to VDD and CVss is quickly switched back to Vss; the logic circuit is at active mode again.

While specific embodiments of the invention have been illustrated and described herein, it is realized that other modifications and changes will occur to those skilled in the art. There are many ways to design the power line control circuit; the design in FIG. 7(b) is one of many possible designs. As illustrated by the example in FIG. 7(c), typically it is desirable to have fast switching time from power saving mode to high performance mode while the switching time from high performance mode to power saving mode can be slow. However, other timing schemes maybe desirable for different applications. The power line control circuit controls the voltages on the power lines (CVDD, CVss, BP, BN) of hybrid logic blocks of the present invention. Proper values of the voltages are dependent on manufacture technologies and applications. Table 3(b) lists exemplary steady-state power line voltages of 130 nm hybrid sub-threshold logic circuits. At active mode, the voltages on power lines are the same as conventional 130 nm logic circuits shown in Table 3(a). At hybrid power saving mode, the steady-state voltage on CVDD (VCVDD) is dropped to 0.7 volts while the steady-state voltage on CVss (VCVss) is raised to 0.5 volts; the voltage on BP (VBP) remains at 1.2 volts while the voltage on BN (VBN) remains at ground. The relative power line voltage (VCVDD−VCVss) is lower than typical threshold voltage of 130 nm logic circuit so that the circuit is under sub-threshold operation at power saving mode. Typically, the power saving mode described in Table 3(b) can reduce leakage current by orders of magnitudes comparing to conventional logic circuits at standby mode. The recovery time of hybrid logic circuits is typically shorter than the recovery time of conventional logic circuits by order(s) of magnitude(s).

Table 3(c) lists another example for steady-state power line voltages of 130 nm hybrid logic circuits. At active mode, the voltages on power lines are the same as conventional 130 nm logic circuits. At hybrid power saving mode, the steady-state voltage on CVDD (VCVDD) is dropped to 0.9 volts while the steady-state voltage on CVss (VCVss) is raised to 0.3 volts; the voltage on BP (VBP) remains at 1.2 volts while the voltage on BN (VBN) remains at ground. The relative power line voltage (VCVDD−VCVss) is higher than typical threshold voltage of 130 nm logic circuit so that the circuit is not under sub-threshold operation. In the mean time, VCVDD is lower than VBP, and VCVss is higher than VBN by at least a quarter of (VDD−Vss), so that this voltage control scheme is under hybrid circuit operations. The power saving conditions in Table 3(c) save less power relative to the power saving conditions in Table 3(b), but it provides faster recovery time.

Table 3(d) lists another example for steady-state power line voltages of 130 nm hybrid logic circuits. At active mode, the voltages on power lines are the same as conventional 130 nm logic circuits except that VBP is at higher voltage (1.5 volts instead of 1.2 volts). At hybrid circuit power saving mode, the voltages on CVDD, BP, and BN remain the same while the steady-state voltage on CVss (VCVss) is raised to 0.6 volts. This is an example of hybrid circuit operation that switches only one power line.

TABLE 3b

Exemplary steady-state power line voltages of 130 nm hybrid sub-threshold logic circuits

| operations | VCVDD (volts) | VBP (volts) | VCVss (volts) | VBN (volts) |
|---|---|---|---|---|
| Active mode | 1.2 | 1.2 | 0 | 0 |
| Hybrid power saving mode | 0.7 | 1.2 | 0.5 | 0 |

TABLE 3c

Exemplary steady-state power line voltages of 130 nm hybrid logic circuits designed for faster recovery time

| operations | VCVDD (volts) | VBP (volts) | VCVss (volts) | VBN (volts) |
|---|---|---|---|---|
| Active mode | 1.2 | 1.2 | 0 | 0 |
| Hybrid power saving mode | 0.9 | 1.2 | 0.3 | 0 |

TABLE 3d

Exemplary steady-state power line voltages of 130 nm hybrid logic circuits when only one power line (CVss) is switched

| operations | VCVDD (volts) | VBP (volts) | VCVss (volts) | VBN (volts) |
|---|---|---|---|---|
| Active mode | 1.2 | 1.5 | 0 | 0 |
| Hybrid power saving mode | 1.2 | 1.5 | 0.6 | 0 |

By definition, a hybrid logic block is a logic circuit block that comprises (a) a controlled power line (CVDD), (b) a substrate power supply line (BP) for p-channel transistors, (c) another controlled power line (CVss), (d) another substrate power supply line (BN) for n-channel transistors, (e) a plurality of hybrid logic gates connected to those 4 power lines (CVDD, BP, CVss, BN), and (f) a power line control circuit that controls CVDD and/or CVss. A hybrid logic gate, by definition, is a logic gate that comprises at least one p-channel Metal-Oxide-Semiconductor (MOS) transistor with source terminal connected to CVDD and substrate terminal connected to BP, and at least one n-channel MOS transistor with source terminal connected to CVss and substrate terminal connected to BN. Typically, the channel lengths of both the p-channel MOS transistor and the n-channel MOS transistor are shorter than 150 nanometers. SRAM memory cells or other types of memory cells are not considered as "hybrid gates" because memory cells are not considered as logic gates. A "power line control circuit" is a circuitry that controls at least one of the controlled power lines (CVDD and/or CVss) of a hybrid logic block. An "active mode" is the condition when (CVDD−CVss)>2 Vt, where Vt is the typical threshold voltage of n-channel logic transistors, and when the substrate voltage (VBN) of n-channel transistors is substantially the same as the voltage on CVss. Active mode supports high performance operations. A "hybrid power saving mode" is defined as the condition when the steady-state voltage (VCVDD) of CVDD is lower than the voltage (VBP) of the p-channel substrate line (BP) by more than (VDD−Vss)/4, where VDD is power line voltage at active mode, and Vss is the ground line voltage at active mode, and when the steady-state voltage (VCVss) of CVss is also higher than the voltage (VBN) of the n-channel substrate line (BN) by more than (VDD−Vss)/4. It is typically preferred to have (VCVDD−VCVss)<Vt as hybrid sub-threshold power saving mode. The definitions of hybrid circuit operation modes are listed in Table 4.

TABLE 4 definitions of hybrid circuit operation modes

| operations | power line voltages | Substrate voltages |
|---|---|---|
| Active mode | (CVDD − CVss) > 2 Vt | CVss ~ VBN |
| Hybrid power saving mode | | (VBP − VCVDD) > (VDD − Vss)/4 |
| | | (VCVss − VBN) > (VDD − Vss)/4 |
| Hybrid sub-threshold power saving mode | (VCVDD − VCVss) < Vt | (VBP − VCVDD) > (VDD − Vss)/4 |
| | | (VCVss − VBN) > (VDD − Vss)/4 |

The leakage currents of hybrid logic circuits at hybrid power saving mode are typically smaller than the leakage currents of conventional logic circuits at standby mode by order(s) of magnitude(s). The performance of hybrid logic circuits at active mode is typically equivalent to the performance of conventional logic circuits. The recover time of hybrid logic circuits is typically shorter than that of conventional logic circuits by order(s) of magnitude(s).

While specific embodiments of the invention have been illustrated and described herein, it is realized that other modifications and changes will occur to those skilled in the art. It is therefore to be understood that the appended claims are intended to cover all modifications and changes as fall within the true spirit and scope of the invention.

What is claimed is:

1. An integrated circuit hybrid logic block comprising:
A controlled power supply line (CVDD);
Another controlled power supply line (CVss);
A substrate power supply line (BP);
Another substrate power supply line (BN);
A plurality of hybrid circuit gates, wherein each hybrid circuit gate comprises at least one p-channel Metal-Oxide-Semiconductor (MOS) transistor with source terminal connected to CVDD and substrate terminal connected to BP, and at least one n-channel MOS transistor with source terminal connected to CVss and substrate terminal connected to BN;
A power line control circuit for switching the voltages on the power supply line(s) between active mode and hybrid power saving mode;
Wherein the steady-state voltage on CVDD at hybrid power saving mode is lower than the voltage on BP by at least a quarter of the voltage on CVDD at active mode minus the voltage on CVss at active mode, and the steady-state voltage on CVss at hybrid power saving mode is higher than the voltage on BN by at least a quarter of the voltage on CVDD at active mode minus the voltage on CVss at active mode.

2. The switching time from hybrid power saving mode to active mode for the hybrid logic block in claim 1 is shorter than one nanosecond.

3. The hybrid circuit gate in claim 1 is a logic storage gate.

4. The hybrid circuit gate in claim 1 is a logic NAND gate.

5. The hybrid circuit gate in claim 1 is a logic NOR gate.

6. The hybrid circuit gate in claim 1 is a logic inverter gate.

7. A method to build an integrated circuit hybrid logic block, comprising the steps of:
Providing a controlled power supply line (CVDD);
Providing another controlled power supply line (CVss);
Providing a substrate power supply line (BP);
Providing another substrate power supply line (BN);
Providing a plurality of hybrid circuit gates, wherein each hybrid circuit gate comprises at least one p-channel Metal-Oxide-Semiconductor (MOS) transistor with source terminal connected to CVDD and substrate terminal connected to BP, and at least one n-channel MOS transistor with source terminal connected to CVss and substrate terminal connected to BN;
Providing a power line control circuit for switching the voltages on the power supply lines between active mode and hybrid power saving mode;
Wherein the steady-state voltage on CVDD at hybrid power saving mode is lower than the voltage on BP by at least a quarter of the voltage on CVDD at active mode minus the voltage on CVss at active mode, and the steady-state voltage on CVss at hybrid power saving mode is higher than the voltage on BN by at least a quarter of the voltage on CVDD at active mode minus the voltage on CVss at active mode.

8. The method in claim 7 comprises the step of controlling the switching time from hybrid power saving mode to active mode for the hybrid logic block in claim 1 to be shorter than one nanosecond.

9. The method in claim 7 comprises the step of configuring the hybrid circuit gate as a logic storage gate.

10. The method in claim 7 comprises the step of configuring the hybrid circuit gate as a logic NAND gate.

11. The method in claim 7 comprises the step of configuring the hybrid circuit gate as a logic NOR gate.

12. The method in claim 7 comprises the step of configuring the hybrid circuit gate as a logic inverter gate.

* * * * *